(12) United States Patent
Yuuki

(10) Patent No.: US 8,432,532 B2
(45) Date of Patent: Apr. 30, 2013

(54) PROJECTION OPTICAL SYSTEM WITH RAREFACTION COMPENSATION

(75) Inventor: Hiroyuki Yuuki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 862 days.

(21) Appl. No.: 12/577,635

(22) Filed: Oct. 12, 2009

(65) Prior Publication Data

US 2010/0091361 A1 Apr. 15, 2010

(30) Foreign Application Priority Data

Oct. 14, 2008 (JP) ................................. 2008-265715

(51) Int. Cl.
*G03B 27/54* (2006.01)

(52) U.S. Cl.
USPC .......................................................... 355/67

(58) Field of Classification Search .................... 355/67; 359/355, 361, 362, 656–661
See application file for complete search history.

(56) References Cited

U.S. PATENT DOCUMENTS

| | | | | |
|---|---|---|---|---|
| 6,339,505 B1* | 1/2002 | Bates | ............................. | 359/642 |
| 6,683,729 B1* | 1/2004 | Schuster | ....................... | 359/656 |
| 6,717,722 B2* | 4/2004 | Shafer et al. | .................. | 359/355 |
| 6,754,002 B2* | 6/2004 | Borrelli et al. | ................. | 359/355 |
| 6,891,596 B2* | 5/2005 | Rostalski et al. | ............... | 355/53 |
| 6,992,753 B2* | 1/2006 | Krahmer et al. | ................. | 355/53 |
| 7,190,527 B2* | 3/2007 | Rostalski et al. | ............. | 359/649 |
| 7,808,615 B2* | 10/2010 | Gruner et al. | .................... | 355/67 |
| 2004/0004757 A1* | 1/2004 | Schuster | ........................ | 359/365 |
| 2008/0119346 A1 | 5/2008 | Otsuka et al. | | |
| 2008/0123074 A1 | 5/2008 | Fujishima | | |
| 2008/0316456 A1* | 12/2008 | Shafer et al. | .................... | 355/67 |

FOREIGN PATENT DOCUMENTS

| | | |
|---|---|---|
| JP | 2005-114881 A | 4/2005 |
| JP | 2006-073687 A | 3/2006 |
| JP | 2006-163369 A | 6/2006 |
| JP | 2008-063181 A | 3/2008 |
| WO | 2005-069055 A | 7/2005 |
| WO | 2005-078773 A | 8/2005 |

OTHER PUBLICATIONS

Verification of compaction and rarefaction models for fused silica with 40 billion pulses of 193-nm excimer laser exposure and their effects on projection lens imaging performance, Proc. SPIE Optical Microlithography XVII vol. 5377,2004.

* cited by examiner

*Primary Examiner* — Mark Consilvio
(74) *Attorney, Agent, or Firm* — Canon U.S.A., Inc. IP Division

(57) ABSTRACT

The present invention provides a projection optical system for projecting a pattern of an object plane onto an image plane, including a first lens whose refractive index irreversibly increases by ultraviolet irradiation, and a second lens whose refractive index irreversibly decreases by the ultraviolet irradiation.

19 Claims, 11 Drawing Sheets

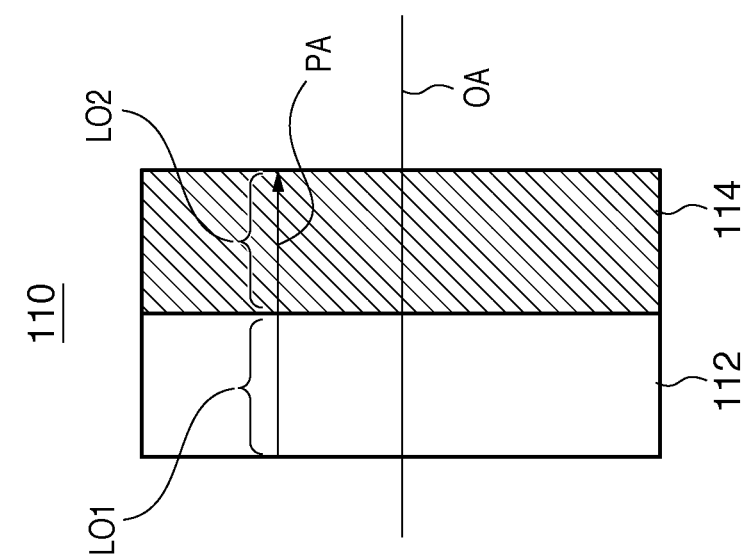
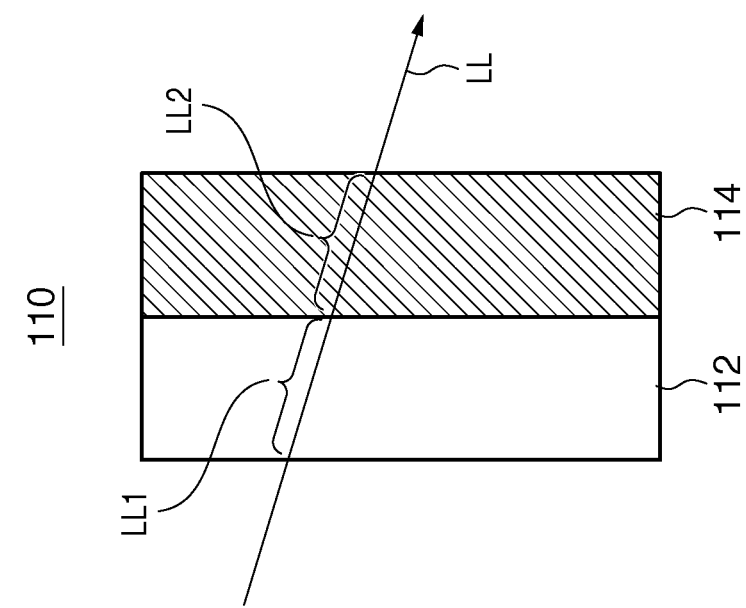
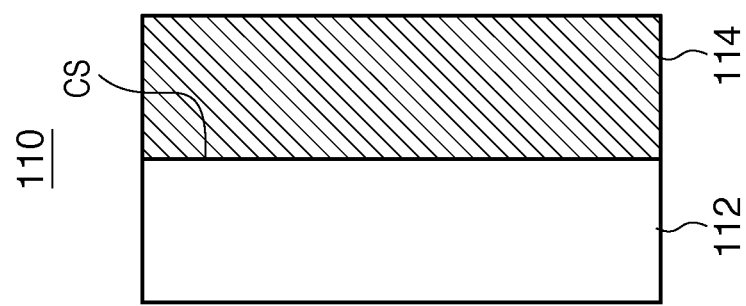

PROJECTION OPTICAL SYSTEM WITH RAREFACTION COMPENSATION

BACKGROUND OF THE INVENTION

1. Field of the Invention

The present invention relates to a projection optical system, exposure apparatus, and device fabrication method.

2. Description of the Related Art

As an optical material (glass material) of a projection optical system or an illumination optical system of an exposure apparatus, synthetic silica glass (synthetic quartz glass) having a high transmittance even in a vacuum ultraviolet region is used. The optical performance of this synthetic silica glass includes not only a transmittance to the wavelength of the exposure light, but also the refractive index uniformity, birefringence, and durability. In particular, it is important not to degrade the refractive index uniformity in order to ensure the exposure performance of the exposure apparatus for a long time period.

On the other hand, when irradiated with ultraviolet light for a long time, the synthetic silica glass changes the refractive index owing to compaction or rarefaction. "Compaction" is a phenomenon in which the density of optical glass in an irradiated region increases by ultraviolet irradiation, and the refractive index of the optical glass (irradiated region) rises in accordance with this density change. "Rarefaction" is a phenomenon in which the density of optical glass in an irradiated region decreases by ultraviolet irradiation, and the refractive index of the optical glass (irradiated region) lowers in accordance with this density change.

Techniques that cope with this refractive index change caused by compaction or rarefaction have conventionally been proposed. Japanese Patent Laid-Open No. 2008-63181 has disclosed a technique that suppresses compaction and rarefaction by controlling the concentrations of hydrogen molecules and OH groups to be contained in synthetic silica glass when manufacturing it. Japanese Patent Laid-Open No. 2005-114881 has disclosed a technique that reduces the influence of compaction on the imaging performance by forming a projection optical system by combining a lens using synthetic silica glass as a glass material and a lens using fluorite as a glass material. Japanese Patent Laid-Open No. 2006-73687 has disclosed a technique that reduces the influence of compaction on the imaging performance by forming a projection optical system by using synthetic silica glass preirradiated with an optical energy higher than an optical energy to be actually radiated per unit area. "Verification of compaction and rarefaction models for fused silica with 40 billion pulses of 193-nm excimer laser exposure and their effects on projection lens imaging performance, Proc. SPIE Optical Microlithography XVII Vol. 5377, 2004 (to be referred to as "reference 1" hereinafter)" has disclosed a technique that forms an optical system by combining a compaction-dominant material and rarefaction-dominant material.

In the technique disclosed in Japanese Patent Laid-Open No. 2008-63181, however, synthetic silica glass that reduces the occurrence of compaction can be manufactured, but it is difficult to assure the exposure performance of an exposure apparatus for a long term owing to the influence of residual compaction.

Also, the technique disclosed in Japanese Patent Laid-Open No. 2005-114881 can reduce the influence of compaction on the imaging performance by appropriately installing the lens using fluorite that does not cause compaction as a glass material. However, fluorite contains intrinsic birefringence that causes hardly correctable aberration in accordance with the polarized state of exposure light. This increases the design difficulty when designing a projection optical system. In addition, the manufacturing cost of the projection optical system rises because fluorite is expensive.

Furthermore, in the technique disclosed in Japanese Patent Laid-Open No. 2006-73687, an optical energy is to be radiated for a long time before processing the shape of an optical element (lens) of a projection optical system. This prolongs the manufacturing time of the projection optical system, and as a consequence raises the manufacturing cost.

Also, reference 1 has no practical description on the combination and layout of the compaction-dominant material and rarefaction-dominant material.

As described above, it is practically difficult for the conventional techniques to provide a projection optical system that reduces deterioration of the imaging performance caused by compaction or rarefaction, and secures the exposure performance of an exposure apparatus for a long time period, while decreasing the manufacturing cost.

SUMMARY OF THE INVENTION

According to one aspect of the present invention, there is provided a projection optical system for projecting a pattern of an object plane onto an image plane, including a first lens whose refractive index increases by ultraviolet irradiation, and a second lens whose refractive index decreases by the ultraviolet irradiation, wherein letting TT be a distance between a first intersection as an intersection of the object plane and an optical axis of the projection optical system, and a second intersection as an intersection of the image plane and the optical axis, a distance D1 between a first central position as a central position of a thickness of the first lens on the optical axis and an intersection position of one of the first intersection and the second intersection which is closer to the first central position satisfies $D1 \leq TT/8$, and a distance D2 between a second central position as a central position of a thickness of the second lens on the optical axis the intersection position satisfies $D2 \leq TT/8$. According to another aspect of the present invention, there is provided that an apparatus including a first lens whose refractive index irreversibly increases by ultraviolet irradiation; and a second lens whose refractive index irreversibly decreases by the ultraviolet irradiation, wherein the first lens and the second lens are cemented.

Further aspects of the present invention will become apparent from the following description of exemplary embodiments with reference to the attached drawings.

BRIEF DESCRIPTION OF THE DRAWINGS

FIG. 5 is a schematic sectional view showing an example of a lens forming the projection optical system as an aspect of the present invention.

FIG. 6 is a schematic sectional view showing an example of the lens forming the projection optical system as an aspect of the present invention.

FIG. 7 is a schematic sectional view showing an example of the lens forming the projection optical system as an aspect of the present invention.

DESCRIPTION OF THE EMBODIMENTS

Figure 1:
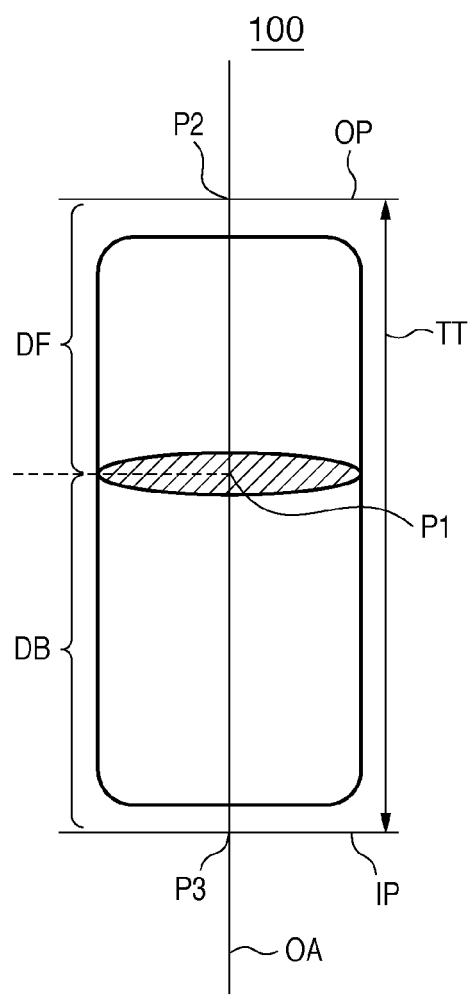
FIG. 1 is a schematic sectional view showing an example of the arrangement of a projection optical system as an aspect of the present invention.

Various embodiments of the present invention will be described below with reference to the accompanying drawings. Note that the same reference numerals denote the same members throughout the drawings, and a repetitive description thereof will not be given.

As described in Japanese Patent Laid-Open No. 2008-63181, in synthetic silica glass to be used as a glass material of a projection optical system or illumination optical system of an exposure apparatus, an irreversible, local refractive index change due to irradiation with ultraviolet light (exposure light) correlates with the energy density of the radiated ultraviolet light. For example, the refractive index change increases as the energy density of the radiated ultraviolet light increases.

In this embodiment, a projection optical system is formed by properly arranging a first lens that has the properties of compaction (i.e., irreversibly increases the refractive index) for a long time period, and a second lens that has the properties of rarefaction (i.e., irreversibly decreases the refractive index) for a long time period. This makes it possible to reduce deterioration of the imaging performance caused by a refractive index change (compaction and rarefaction) due to ultraviolet irradiation, and obtain long-term stability of the imaging performance.

Also, as described in reference 1, the irreversible, local refractive index change due to ultraviolet irradiation depends on the cumulative irradiation energy amount of the radiated ultraviolet light as well. Reference 1 has reported glass that has the properties of compaction in the initial stages of ultraviolet irradiation, but changes to the properties of rarefaction as the cumulative irradiation energy increases. This glass shows the properties of rarefaction for a long term although it initially has the properties of compaction. In this embodiment, therefore, this glass is regarded as having the properties of rarefaction. Similarly, glass that initially has the properties of rarefaction but shows the properties of compaction for a long term is regarded as having the properties of compaction in this embodiment.

As previously described, synthetic silica glass is mainly used as the glass material of a projection optical system of an exposure apparatus using a KrF excimer laser or ArF excimer laser as an exposure light source. As described in Japanese Patent Laid-Open No. 2008-63181, a refractive index change in the synthetic silica glass caused by ultraviolet irradiation is closely related to the densities of OH groups and hydrogen molecules contained in the synthetic silica glass. Accordingly, the characteristic of the refractive index change (whether it is compaction or rarefaction) with respect to the energy density or cumulative irradiation energy amount can be classified in accordance with the OH group density or hydrogen molecular density.

To form a projection optical system by appropriately arranging the first lens having the properties of compaction for a long term and the second lens having the properties of rarefaction for a long term, use synthetic silica glass materials different in OH group density or hydrogen molecular density is to be used. Note that glass materials are generally classified based on the main components. Therefore, even when the contents of an impurity such as an OH group or hydrogen molecule are different (i.e., even when the OH group densities or hydrogen molecular densities are different), glass materials are classified as synthetic silica glass as the type of glass material if the glass materials have the same main component. In this embodiment as described above, glass materials containing the same element as a main component will be referred to as "glass materials having the same main component" regardless of the impurity contents.

Also, to effectively reduce deterioration of the imaging performance caused by the refractive index change due to ultraviolet irradiation, the first lens having the properties of compaction for a long term and the second lens having the properties of rarefaction for a long term are close to or adjacent to each other. In other words, the lenses made of glass materials different in OH group density or hydrogen molecular density are close to or adjacent to each other. This is so because a plurality of lenses forming a projection optical system each have a unique in-lens illumination distribution resulting from irradiation with exposure light (ultraviolet light), but lenses arranged close to each other have similar in-lens illumination distributions.

The irreversible refractive index change due to ultraviolet irradiation locally occurs near a region irradiated with exposure light. Accordingly, the in-lens distribution of the irreversible refractive index change due to irradiation with exposure light (ultraviolet light) depends on the in-lens illumination distribution. Therefore, lenses made of glass materials (synthetic silica glass) having opposite refractive index changes due to ultraviolet irradiation are arranged in positions where the in-lens illumination distributions are relatively similar. This makes it possible to reduce an optical path length change corresponding to the refractive index change, thereby effectively reducing deterioration of the imaging performance.

It is also possible to correct deterioration of the imaging performance caused by compaction and rarefaction by, for example, driving an optical member in the projection optical system, driving a wafer, or changing the wavelength of exposure light. In this case, however, deterioration of the imaging performance caused by compaction and rarefaction cannot completely be corrected and remains.

The in-lens distribution of the refractive index change due to compaction and rarefaction depends on the in-lens illumination distribution, and the in-lens illumination distribution changes into various shapes in accordance with reticle patterns or illumination conditions. Accordingly, the in-lens distribution of the refractive index change often has a unique shape, and deterioration of the imaging performance also has unique properties. This makes it difficult to correct deterioration of the imaging performance by, for example, driving an optical member in the projection optical system, driving a wafer, or changing the wavelength of exposure light.

In addition, as previously described, the irreversible refractive index change due to ultraviolet irradiation correlates with the energy density. Therefore, the first lens having the properties of compaction for a long term and the second lens having the properties of rarefaction for a long term are arranged in positions where the energy density is high in the projection optical system. This is so because the irreversible refractive index change due to irradiation with exposure light (ultraviolet light) is large in a position where the energy density is high.

For example, since exposure light concentrates near an object plane (reticle surface) or an image plane (wafer surface), the energy density is relatively high near the object plane or image plane. Also, in a projection optical system for forming a real image (an intermediate image of a real image), exposure light concentrates near the intermediate image, so the energy density is relatively high near the intermediate image. In addition, the energy density is relatively high near the pupil of a projection optical system because exposure light concentrates owing to pupil imaging. Furthermore, in a projection optical system, the energy density is relatively high near a waist position (to be described later) because the effective diameter is small in the waist position.

A projection optical system as an aspect of the present invention will be explained in detail below.

FIG. 1 is a schematic sectional view showing an example of the arrangement of a projection optical system 100. The projection optical system 100 is an optical system that projects patterns of an object plane (reticle surface) OP onto an image plane (wafer surface) IP, and includes a plurality of lenses and a plurality of optical members.

First, a system in which lenses (the first lens having the properties of compaction and the second lens having the properties of rarefaction) made of glass materials (synthetic silica glass) having opposite refractive index changes due to ultraviolet irradiation are arranged near the object plane OP will be explained with reference to FIG. 1.

Within the range in which a distance DF between a central position P1 of the thickness of a lens on an optical axis OA of the projection optical system and a position P2 of the intersection (first intersection) of the object plane OP and optical axis OA satisfies expression (1) below, the energy density is relatively high owing to the influence of exposure light that concentrates toward the object plane OP. Note that TT is the distance between the object plane OP and image plane IP, that is, the distance between the position (first intersection position) P2 of the intersection of the object plane OP and optical axis OA and a position (second intersection position) P3 of the intersection (second intersection) of the image plane IP and optical axis OA.

$$DF \leq TT/8 \tag{1}$$

Accordingly, lenses within the range meeting expression (1) have relatively large influences on deterioration of the imaging performance caused by compaction or rarefaction. Therefore, at least one of the lenses within the range meeting expression (1) is used as the first lens having the properties of compaction for a long term. In addition, at least one of the lenses within the range meeting expression (1) is used as the second lens having the properties of rarefaction for a long term. Consequently, the influence of rarefaction on the imaging performance cancels that of compaction on the imaging performance. This makes it possible to reduce deterioration of the imaging performance caused by compaction and rarefaction.

Furthermore, within the range in which the distance DF between the central position P1 of the thickness of a lens and the position P2 of the intersection of the object plane OP and optical axis OA satisfies expression (2) below, the influence of the exposure light that concentrates toward the object plane OP further increases, so the energy density further rises.

$$DF \leq TT/12 \tag{2}$$

Accordingly, of lenses within the range meeting expression (2), at least one is used as the first lens having the properties of compaction for a long term, and at least one is used as the second lens having the properties of rarefaction for a long term.

Next, a system in which lenses made of glass materials (synthetic silica glass) having opposite refractive index changes due to ultraviolet irradiation are arranged near the image plane IP will be explained with reference to FIG. 1.

Within the range in which a distance DB between the central position P1 of the thickness of a lens on the optical axis OA of the optical system and the position P3 of the intersection of the image plane IP and optical axis OA satisfies expression (3) below, the energy density is relatively high owing to the influence of exposure light that concentrates toward the image plane IP.

$$DB \leq TT/8 \tag{3}$$

Accordingly, lenses within the range meeting expression (3) have relatively large influences on deterioration of the imaging performance caused by compaction or rarefaction. Therefore, at least one of the lenses within the range meeting expression (3) is used as the first lens having the properties of compaction for a long term. In addition, at least one of the lenses within the range meeting expression (3) is used as the second lens having the properties of rarefaction for a long term. Consequently, the influence of rarefaction on the imaging performance cancels that of compaction on the imaging performance. This makes it possible to reduce deterioration of the imaging performance caused by compaction and rarefaction.

Furthermore, within the range in which the distance DB between the central position P1 of the thickness of a lens and the position P3 of the intersection of the image plane IP and optical axis OA satisfies expression (4) below, the influence of the exposure light that concentrates toward the image plane IP further increases, so the energy density further rises.

$$DB \leq TT/12 \tag{4}$$

Accordingly, of lenses within the range meeting expression (4), at least one is used as the first lens having the properties of compaction for a long term, and at least one is used as the second lens having the properties of rarefaction for a long term.

Note that the projection optical system 100 shown in FIG. 1 is exemplary, and the present invention is not limited to a coaxial optical system in which the optical axis OA is represented by one straight line. For example, the present invention is also applicable to a decentered optical system in which the optical axis OA bends.

Figure 2:
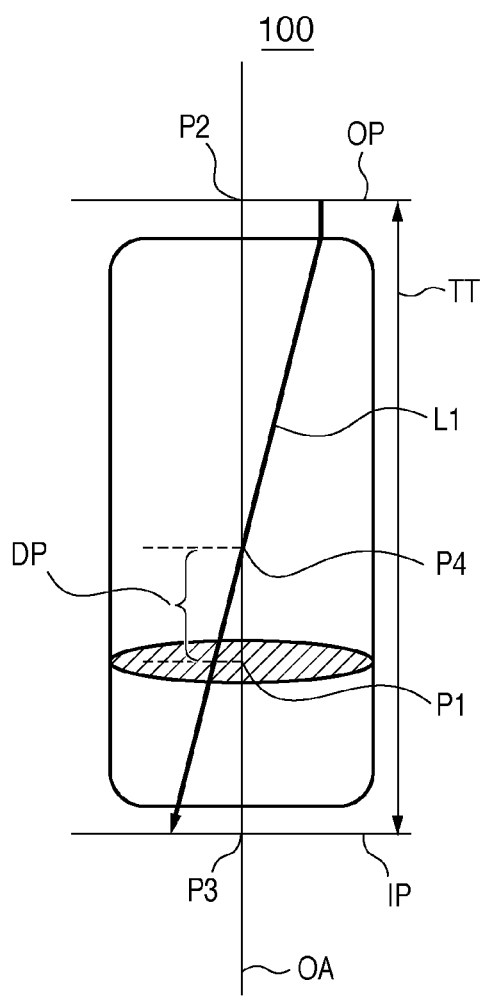
FIG. 2 is a schematic sectional view showing an example of the arrangement of the projection optical system as an aspect of the present invention.

A system in which lenses made of glass materials (synthetic silica glass) having opposite refractive index changes due to ultraviolet irradiation are arranged near a pupil position P4 will be explained below with reference to FIG. 2. Note that the pupil position P4 is the position of the intersection of the optical axis OA and a light beam L1 output from a position farthest from the optical axis OA in the effective region of the object plane OP and entering the image plane IP parallel to the optical axis OA. Note also that the light beam L1 will be referred to as a most outer off-axis principal ray in this embodiment. FIG. 2 is a schematic sectional view showing an example of the arrangement of the projection optical system 100.

Within the range in which a distance DP between the central position P1 of the thickness of a lens on the optical axis OA of the projection optical system and the pupil position P4 satisfies expression (5) below, the energy density is relatively high owing to the influence of exposure light that concentrates toward the pupil.

$$DP \leq TT/8 \qquad (5)$$

Accordingly, lenses within the range meeting expression (5) have relatively large influences on deterioration of the imaging performance caused by compaction or rarefaction. Therefore, at least one of the lenses within the range meeting expression (5) is used as the first lens having the properties of compaction for a long term. In addition, at least one of the lenses within the range meeting expression (5) is used as the second lens having the properties of rarefaction for a long term. In other words, a distance DP1 between the central position of the thickness of the first lens on the optical axis OA and the pupil position at a shortest distance from this central position and a distance DP2 between the central position of the thickness of the second lens on the optical axis OA and the pupil position satisfy expression (5). That is, DP is replaced with DP1 or DP2 in expression (5). Consequently, the influence of rarefaction on the imaging performance cancels that of compaction on the imaging performance. This makes it possible to reduce deterioration of the imaging performance caused by compaction and rarefaction.

Furthermore, within the range in which the distance DP between the central position P1 of the thickness of a lens and the pupil position P4 satisfies expression (6) below, the influence of the exposure light that concentrates toward the pupil further increases, so the energy density further rises.

$$DP \leq TT/12 \qquad (6)$$

Accordingly, of lenses within the range meeting expression (6), at least one is used as the first lens having the properties of compaction for a long term, and at least one is used as the second lens having the properties of rarefaction for a long term.

Note that the projection optical system 100 shown in FIG. 2 is exemplary, and the present invention is not limited to an optical system having only one pupil image. For example, the present invention is also applicable to an optical system having a plurality of pupil images.

Figure 3:
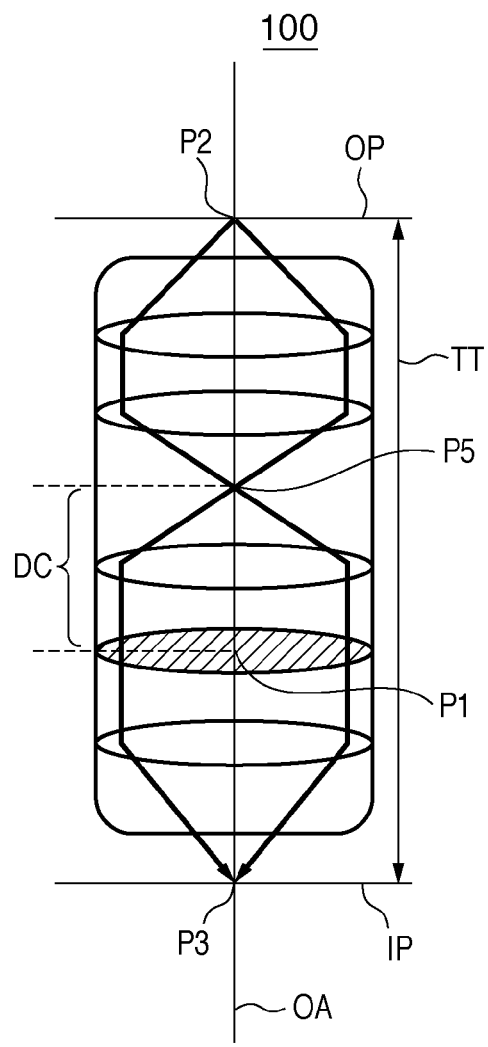
FIG. 3 is a schematic sectional view showing an example of the arrangement of the projection optical system as an aspect of the present invention.

A system in which lenses made of glass materials (synthetic silica glass) having opposite refractive index changes due to ultraviolet irradiation are arranged near an intermediate image position P5 of a real image will be explained below with reference to FIG. 3. The projection optical system 100 shown in FIG. 3 forms an intermediate image of a real image. The intermediate image of a real image means the formation of a real image on a plane other than the object plane OP and image plane IP between the object plane OP and image plane IP. Also, the intermediate image position P5 is the paraxial imaging position of the intermediate image of a real image. FIG. 3 is a schematic sectional view showing an example of the arrangement of the projection optical system 100.

Within the range in which a distance DC between the central position P1 of the thickness of a lens on the optical axis OA of the projection optical system and the intermediate image position P5 satisfies expression (7) below, the energy density is relatively high owing to the influence of exposure light that concentrates toward the intermediate image of a real image.

$$DC \leq TT/6 \qquad (7)$$

Accordingly, lenses within the range meeting expression (7) have relatively large influences on deterioration of the imaging performance caused by compaction or rarefaction. Therefore, at least one of the lenses within the range meeting expression (7) is used as the first lens having the properties of compaction for a long term. In addition, at least one of the lenses within the range meeting expression (7) is used as the second lens having the properties of rarefaction for a long term. In other words, a distance DC1 between the central position of the thickness of the first lens on the optical axis OA and the intermediate image position at a shortest distance from this central position and a distance DC2 between the central position of the thickness of the second lens on the optical axis OA and the intermediate image position satisfy expression (7). That is, DC is replaced with DC1 or DC2 in expression (7). Consequently, the influence of rarefaction on the imaging performance cancels that of compaction on the imaging performance. This makes it possible to reduce deterioration of the imaging performance caused by compaction and rarefaction.

Furthermore, within the range in which the distance DC between the central position P1 of the thickness of the lens and the intermediate image position P5 satisfies expression (8) below, the influence of the exposure light that concentrates toward the intermediate image of a real image further increases, so the energy density further rises.

$$DC \leq TT/7 \qquad (8)$$

Accordingly, of lenses within the range meeting expression (8), at least one is used as the first lens having the properties of compaction for a long term, and at least one is used as the second lens having the properties of rarefaction for a long term.

Note that the projection optical system 100 shown in FIG. 3 is exemplary, and the present invention is not limited to a projection optical system that forms only one intermediate image of a real image. For example, the present invention is also applicable to a projection optical system that forms intermediate images of a plurality of real images.

Figure 4:
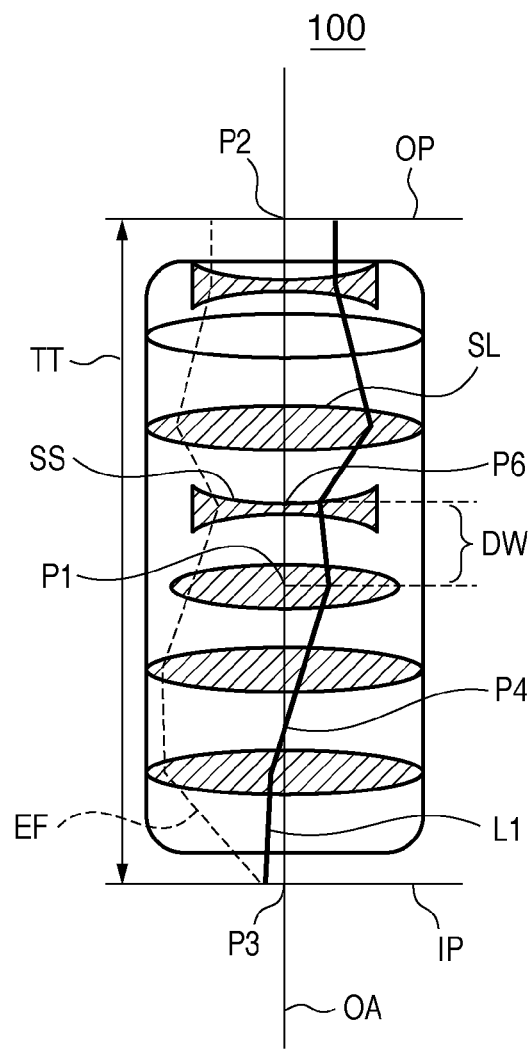
FIG. 4 is a schematic sectional view showing an example of the arrangement of the projection optical system as an aspect of the present invention.

A system in which lenses made of glass materials (synthetic silica glass) having opposite refractive index changes due to ultraviolet irradiation are arranged near a waist position P6 will be explained below with reference to FIG. 4. The waist position P6 is the position of the intersection of the optical axis OA and an optical plane SS where an effective region on the optical plane is minimum, between the pupil position P4 and an optical plane SL where the distance between the most off-axis principal ray L1 and the optical axis OA is maximum among optical planes of the projection optical system 100. Also, the optical plane is the surface (lens surface) of a lens to be irradiated with exposure light from the object plane OP in the projection optical system 100. Note that in FIG. 4, EF exemplarily represents the position of an effective region farthest from the optical axis OA. FIG. 4 is a schematic sectional view showing an example of the arrangement of the projection optical system 100.

Within the range in which a distance DW between the central position P1 of the thickness of a lens on the optical axis OA of the projection optical system and the waist position P6 satisfies expression (9) below, the energy density is relatively high because the effective region is small.

$$DW \leq TT/11 \tag{9}$$

Accordingly, lenses within the range meeting expression (9) have relatively large influences on deterioration of the imaging performance caused by compaction or rarefaction. Therefore, at least one of the lenses within the range meeting expression (9) is used as the first lens having the properties of compaction for a long term. In addition, at least one of the lenses within the range meeting expression (9) is used as the second lens having the properties of rarefaction for a long term. In other words, a distance DW1 between the central position of the thickness of the first lens on the optical axis OA and the waist position at a shortest distance from this central position and a distance DW2 between the central position of the thickness of the second lens on the optical axis OA and the waist position satisfy expression (9). That is, DW is replaced with DW1 or DW2 in expression (9). Consequently, the influence of rarefaction on the imaging performance cancels that of compaction on the imaging performance. This makes it possible to reduce deterioration of the imaging performance caused by compaction and rarefaction.

Furthermore, within the range in which the distance DW between the central position P1 of the thickness of the lens and the waist position P6 satisfies expression (10) below, the energy density further rises because the effective region further decreases.

$$DW \leq TT/22 \tag{10}$$

Accordingly, of lenses within the range meeting expression (10), at least one is used as the first lens having the properties of compaction for a long term, and at least one lens is used as the second lens having the properties of rarefaction for a long term.

Note that the projection optical system 100 shown in FIG. 4 is exemplary, and the present invention is not limited to a projection optical system including convex lenses and concave lenses.

Also, the position P2 of the intersection of the object plane OP and optical axis OA and the position P3 of the intersection of the image plane IP and optical axis OA in the projection optical system 100 are optically conjugate positions. Assuming that these positions are called imaging conjugate positions, a system in which lenses made of glass materials (synthetic silica glass) having opposite refractory index changes due to ultraviolet irradiation are arranged near the object plane OP or image plane IP is as follows.

Let D1 be the distance between the central position (first central position) of the thickness of the first lens on the optical axis OA and an imaging conjugate position at a shortest distance from this central position. Likewise, let D2 be the distance between the imaging conjugate position at the shortest distance and the central position (second central position) of the thickness of the second lens on the optical axis OA. In other words, of the intersection of the object plane OP and optical axis OA and the intersection of the image plane IP and optical axis OA, D1 is the distance to the position of the intersection closer to the central position of the thickness of the first lens on the optical axis OA. Also, D2 is the distance between this intersection position and the central position of the thickness of the second lens on the optical axis OA. In this case, the projection optical system 100 is formed to satisfy $$D1 \leq TT/8 \tag{11}$$

$$D2 \leq TT/8 \tag{12}$$

In addition, the projection optical system 100 is formed to satisfy $$D1 \leq TT/12 \tag{13}$$

$$D2 \leq TT/12 \tag{14}$$

Consequently, the influence of rarefaction on the imaging performance cancels that of compaction on the imaging performance. This makes it possible to reduce deterioration of the imaging performance caused by compaction and rarefaction.

Also, of the plurality of lenses forming the projection optical system 100, the shorter the distance between lenses, the more similar the in-lens illumination distributions of the lenses. Accordingly, deterioration of the imaging performance caused by compaction and rarefaction can further be reduced by cementing the first lens having the properties of compaction and the second lens having the properties of rarefaction.

FIG. 5 is a schematic sectional view showing an example of a lens 110 forming the projection optical system 100. The lens 110 is formed by cementing, via a junction surface CS, a first lens 112 having the properties of compaction and a second lens 114 having the properties of rarefaction. This makes the similarity between the illumination distributions of the first lens 112 and second lens 114 higher than those between the illumination distributions of other lenses forming the projection optical system 100. Since this increases the similarity between the local refractive index change distributions obtained by compaction and rarefaction, it is possible to more effectively cancel the influence of compaction by that of rarefaction. In other words, deterioration of the imaging performance caused by compaction and rarefaction can effectively be reduced.

Note that the lens 110 forming the projection optical system 100 shown in FIG. 5 is exemplary, and the first lens 112 and second lens 114 are not limited to parallel plates. For example, each of the first lens 112 and second lens 114 may also be a lens having a positive or negative refracting force. Also, the junction surface CS is not limited to a flat surface, and may also be a curved surface, a staircase shape, or another three-dimensional shape.

Furthermore, the first lens 112 and second lens 114 are cemented by, for example, an optical contact. The use of the optical contact makes it possible to reduce a relative positional difference between the first lens 112 and second lens 114, and reduce deterioration of the imaging performance cause by the positional difference. Note that the same effect can be obtained even when cementing the first lens 112 and second lens 114 by an adhesive.

As shown in FIG. 6, the lens 110 is formed such that a light beam length LL1 along the light beam direction of a light beam LL passing through the first lens 112 and a light beam length LL2 along the light beam direction of the light beam LL passing through the second lens 114 satisfy expression (15) below. In other words, the shapes of the first lens 112, second lens 114, and junction surface CS are defined so as to satisfy $$\delta n1 \times LL1 = -\delta n2 \times LL2 \quad (15)$$

This makes it possible to more effectively cancel the influence of compaction by that of rarefaction. In other words, deterioration of the imaging performance caused by compaction and rarefaction can effectively be reduced.

Note that in expression (15), $\delta n1$ indicates the irreversible refractive index change rate of the first lens 112 with respect to the light beam LL (i.e., due to irradiation with the light beam LL). $\delta n2$ indicates the irreversible refractive index change rate of the second lens 114 with respect to the light beam LL (i.e., due to irradiation with the light beam LL).

The direction of the light beam LL passing through the lens 110 (the first lens 112 and second lens 114) forming the projection optical system 100 is not limited, so all light beams in actual exposure are applicable. In other words, the light beam LL can arbitrarily be selected from light beams in actual exposure. Note that the light beam lengths LL1 and LL2 may also be defined by the average value of the light beam lengths of the light beams in actual exposure. When one of the first lens 112 and second lens 114 has an aspherical surface, the light beam lengths LL1 and LL2 may also be selected from spherical components as practical references of the aspherical surface.

Furthermore, as shown in FIG. 7, the lens 110 is formed such that a distance LO1 of an axis PA, which is parallel to the optical axis OA, in the first lens 112 and a distance LO2 of the axis PA in the second lens 114 satisfy expression (16) below. In other words, the shapes of the first lens 112, second lens 114, and junction surface CS are defined so as to satisfy $$\delta n1 \times LO1 = -\delta n2 \times LO2 \quad (16)$$

This makes it possible to more effectively cancel the influence of compaction by that of rarefaction. In other words, deterioration of the imaging performance caused by compaction and rarefaction can effectively be reduced.

Also, the position of the axis PA (the relative position of the axis PA and optical axis OA) is not limited to that shown in FIG. 7, and can be selected from arbitrary positions in the first lens 112 and second lens 114. Note that the distances LO1 and LO2 may also be defined by the average value of the distances between irradiated portions of the first lens 112 and second lens 114 in actual exposure. When one of the first lens 112 and second lens 114 has an aspherical surface, the distances LO1 and LO2 may also be selected from spherical components as practical references of the aspherical surface.

The projection optical system as an aspect of the present invention will be explained in more detail below.

Figure 8:
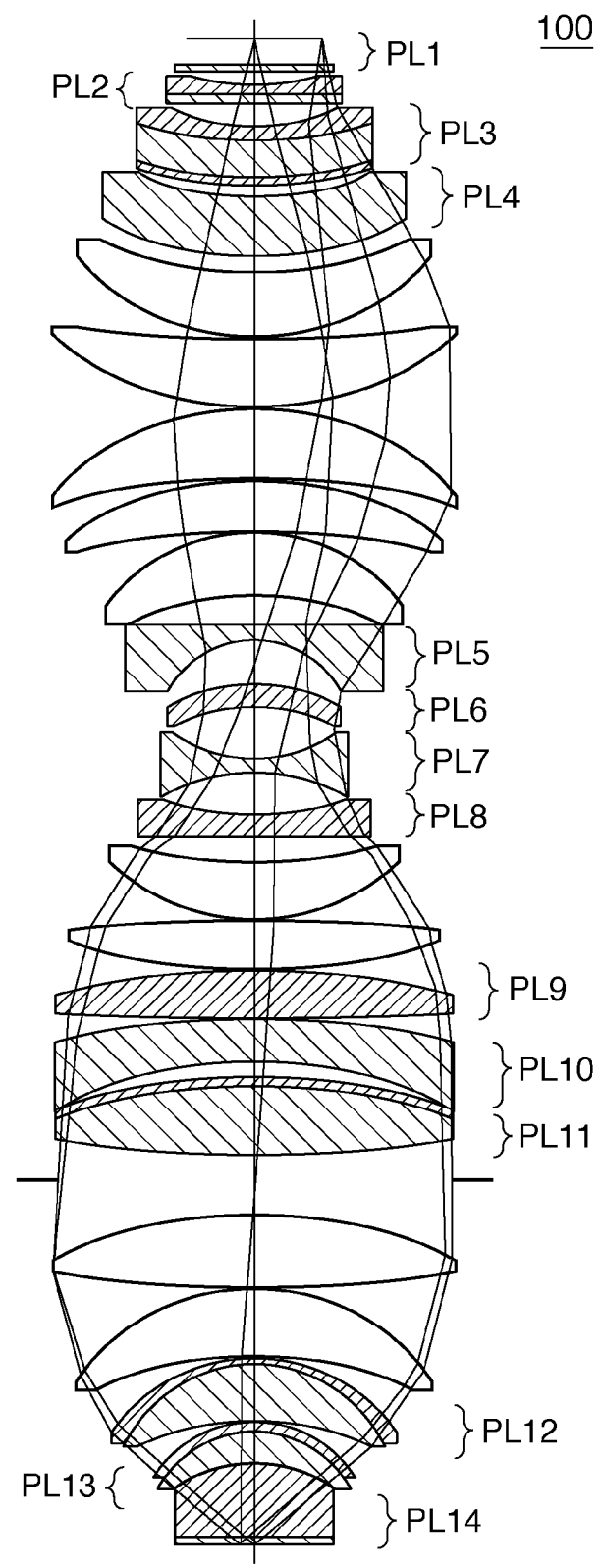
FIG. 8 is a schematic sectional view showing an example of a practical arrangement of the projection optical system as an aspect of the present invention.

FIG. 8 is a schematic sectional view showing a projection optical system 100 formed by referring to Table 1 of Japanese Patent Laid-Open No. 2006-163369. The projection optical system 100 shown in FIG. 8 is formed by arranging lenses made of glass materials (synthetic silica glass) having opposite refractive index changes due to ultraviolet irradiation near the object plane, pupil position, image plane, and waist position.

Figure 9:
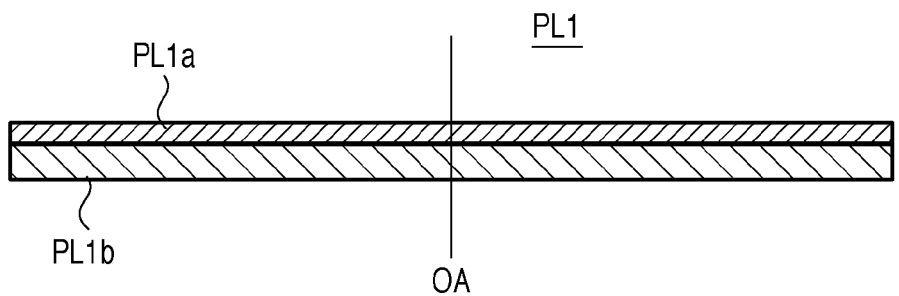
FIG. 9 is an enlarged partial sectional view of a lens forming the projection optical system shown in FIG. 8.
Figure 10:
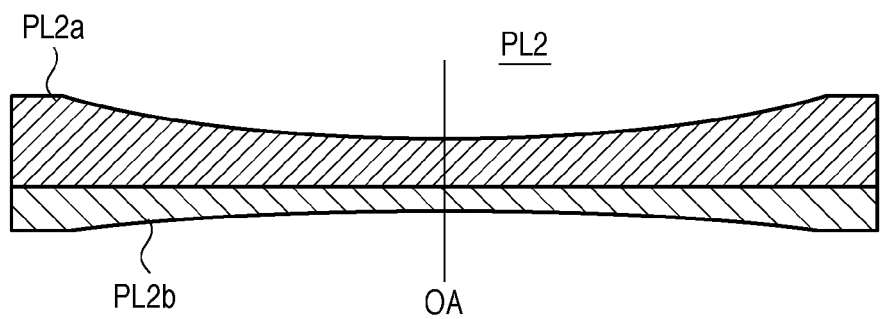
FIG. 10 is an enlarged partial sectional view of a lens forming the projection optical system shown in FIG. 8.
Figure 11:
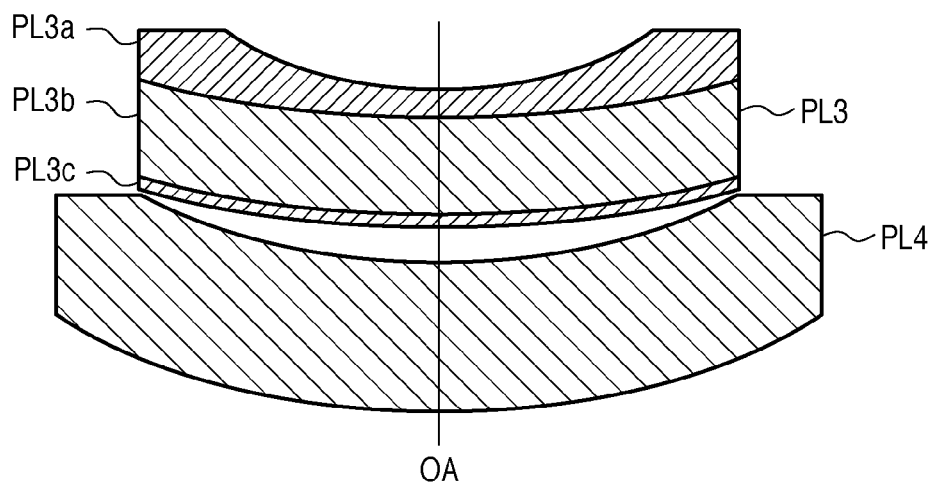
FIG. 11 is an enlarged partial sectional view of a lens forming the projection optical system shown in FIG. 8.

First, the lenses near the object plane will be explained with reference to FIGS. 9 to 11. FIG. 9 is an enlarged partial sectional view of a lens PL1 forming the projection optical system 100 shown in FIG. 8. FIG. 10 is an enlarged partial sectional view of a lens PL2 forming the projection optical system 100 shown in FIG. 8. FIG. 11 is an enlarged partial sectional view of lenses PL3 and PL4 forming the projection optical system 100 shown in FIG. 8.

As shown in FIG. 9, the lens PL1 is a cemented lens obtained by cementing lenses PL1$a$ and PL1$b$. Note that one of the lenses PL1$a$ and PL1$b$ is a lens (the first lens) having the properties of compaction for a long term, and the other is a lens (the second lens) having the properties of rarefaction for a long term.

As shown in FIG. 10, the lens PL2 is a cemented lens obtained by cementing lenses PL2$a$ and PL2$b$. Note that one of the lenses PL2$a$ and PL2$b$ is a lens (the first lens) having the properties of compaction for a long term, and the other is a lens (the second lens) having the properties of rarefaction for a long term.

As shown in FIG. 11, the lens PL3 is a cemented lens obtained by cementing lenses PL3$a$, PL3$b$, and PL3$c$. On the other hand, the lens PL4 is not a cemented lens but a normal lens. One of the lenses PL3$a$ and PL3$b$ is a lens (the first lens) having the properties of compaction for a long term, and the other is a lens (the second lens) having the properties of rarefaction for a long term. Also, one of the lenses PL3$c$ and PL4 is a lens (the first lens) having the properties of compaction for a long term, and the other is a lens (the second lens) having the properties of rarefaction for a long term. In this arrangement, an in-lens distribution having a relatively high similarity to the in-lens distribution of the refractive index change in the lens PL4 can be produced in the lens PL3$c$. This makes it possible to more effectively cancel the influence of compaction by that of rarefaction.

Table 1 below shows the numerical specifications (the curvature, thickness, and refractive index) of the lens PL1 (lenses PL1$a$ and PL1$b$), the lens PL2 (lenses PL2$a$ and PL2$b$), the lens PL3 (lenses PL3$a$, PL3$b$, and PL3$c$), and the lens PL4. Table 1 also shows the distance DF of each lens.

TABLE 1

| Lens | Radius of curvature | Thickness | Refractive index | DF | TT/DF |
|---|---|---|---|---|---|
| PL1a | ∞ | 3.000 | 1.560326 | 19.5 | 64.1 |
|  | ∞ | 0.000 |  |  |  |
| PL1b | ∞ | 5.000 | 1.560326 | 23.5 | 53.2 |
|  | ∞ | 10.157 |  |  |  |
| PL2a | −289.036 | 8.000 | 1.560326 | 40.2 | 31.1 |
|  | ∞ | 0.000 |  |  |  |
| PL2b | ∞ | 4.000 | 1.560326 | 46.2 | 27.1 |
|  | 418.109 | 24.539 |  |  |  |
| PL3a | −142.063 | 10.000 | 1.560326 | 77.7 | 16.1 |
|  | −379.154 | 0.000 |  |  |  |
| PL3b | −379.154 | 32.000 | 1.560326 | 98.7 | 12.7 |
|  | −379.154 | 0.000 |  |  |  |
| PL3c | −379.154 | 4.000 | 1.560326 | 116.7 | 10.7 |
|  | −379.154 | 11.395 |  |  |  |
| PL4 | −301.615 | 50.000 | 1.560326 | 155.1 | 8.1 |
|  | −268.436 |  |  |  |  |

In the projection optical system 100 shown in FIG. 8, TT=1249.386 mm, and the lenses PL1$a$ and PL1$b$ are formed to satisfy expressions (1) and (2). Likewise, the lenses PL2$a$ and PL2$b$ and the lenses PL3$a$ and PL3$b$ are formed to satisfy expressions (1) and (2). Also, the lenses PL3$c$ and PL4 are formed to satisfy expression (1).

In this arrangement, the influence of rarefaction on the imaging performance cancels that of compaction on the imaging performance, so stable imaging performance can be obtained for a long time period. In addition, the lenses PL1$a$ and PL1b, PL2a and PL2b, and PL3a and PL3b meeting expression (2) are irradiated with an energy density higher than that irradiating the lenses PL3c and PL4 meeting expression (1), so a higher effect can be obtained by the former lenses.

Figure 12:
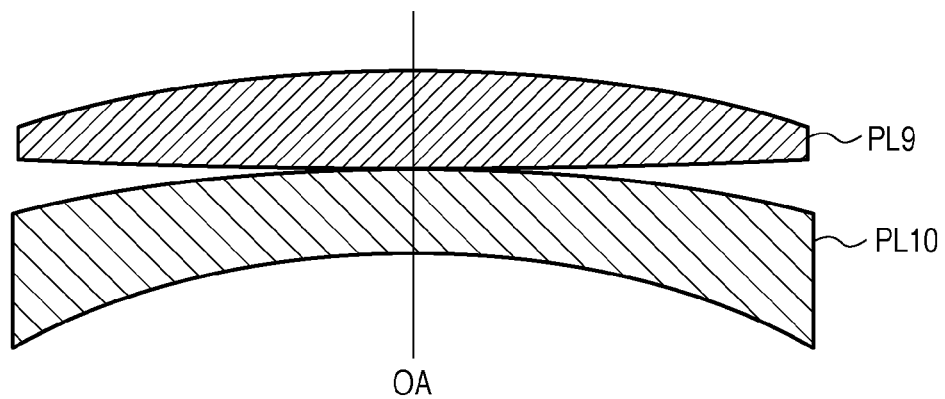
FIG. 12 is an enlarged partial sectional view of a lens forming the projection optical system shown in FIG. 8.
Figure 13:
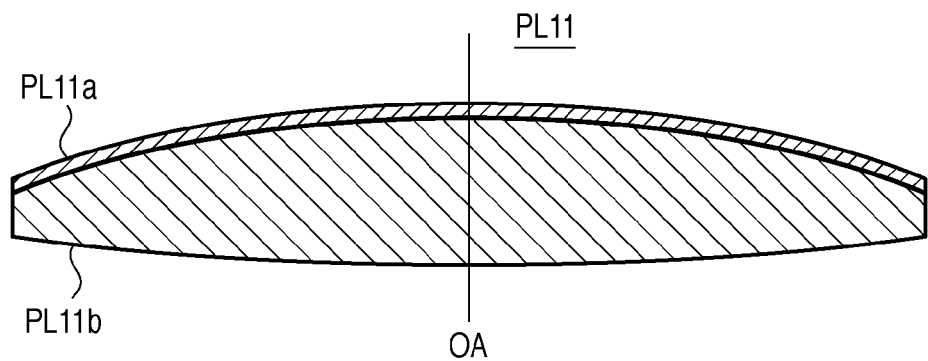
FIG. 13 is an enlarged partial sectional view of a lens forming the projection optical system shown in FIG. 8.

Next, the lenses close to the pupil position will be explained with reference to FIGS. 12 and 13. FIG. 12 is an enlarged partial sectional view of lenses PL9 and PL10 forming the projection optical system 100 shown in FIG. 8. FIG. 13 is an enlarged partial sectional view of a lens PL11 forming the projection optical system 100 shown in FIG. 8.

As shown in FIG. 12, the lenses PL9 and PL10 are not cemented lenses but normal lenses. One of the lenses PL9 and PL10 is a lens (the first lens) having the properties of compaction for a long term, and the other is a lens (the second lens) having the properties of rarefaction for a long term.

As shown in FIG. 13, the lens PL11 is a cemented lens obtained by cementing lenses PL11a and PL11b. Note that one of the lenses PL11a and PL11b is a lens (the first lens) having the properties of compaction for a long term, and the other is a lens (the second lens) having the properties of rarefaction for a long term.

Table 2 below shows the numerical specifications (the curvature, thickness, and refractive index) of the lens PL9, the lens PL10, the lens PL11 (lenses PL11a and PL11b). Table 2 also shows the distance DP of each lens.

TABLE 2

| Lens | Radius of curvature | Thickness | Refractive index | DP | TT/DP |
|---|---|---|---|---|---|
| PL9 | 611.973 | 40.000 | 1.560326 | 154.9 | 8.1 |
| | −6298.101 | 1.000 | | | |
| PL10 | 728.162 | 35.217 | 1.560326 | 116.3 | 10.7 |
| | 361.302 | 14.555 | | | |
| PL11a | 534.727 | 4.000 | 1.560326 | 82.1 | 15.2 |
| | 534.727 | 0.000 | | | |
| PL11b | 534.727 | 56.000 | 1.560326 | 52.1 | 24.0 |
| | −1287.947 | | | | |

The lenses PL9 and PL10 are formed to satisfy expression (5). Also, the lenses PL11a and PL11b are formed to satisfy expressions (5) and (6).

In this arrangement, the influence of rarefaction on the imaging performance cancels that of compaction on the imaging performance, so stable imaging performance can be obtained for a long time period. In addition, the lenses PL11a and PL11b meeting expression (6) are irradiated with an energy density higher than that irradiating the lenses PL9 and PL10 meeting expression (5), so a higher effect can be obtained by the former lenses.

Figure 14:
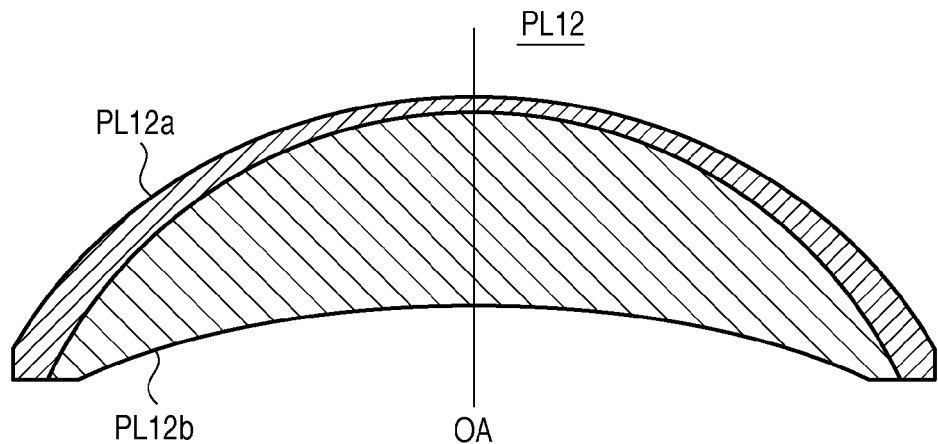
FIG. 14 is an enlarged partial sectional view of a lens forming the projection optical system shown in FIG. 8.
Figure 15:
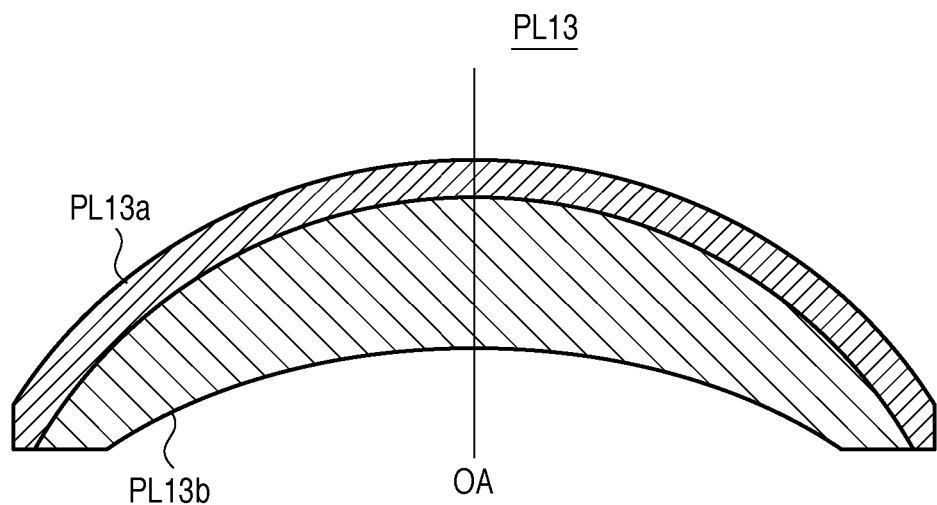
FIG. 15 is an enlarged partial sectional view of a lens forming the projection optical system shown in FIG. 8.
Figure 16:
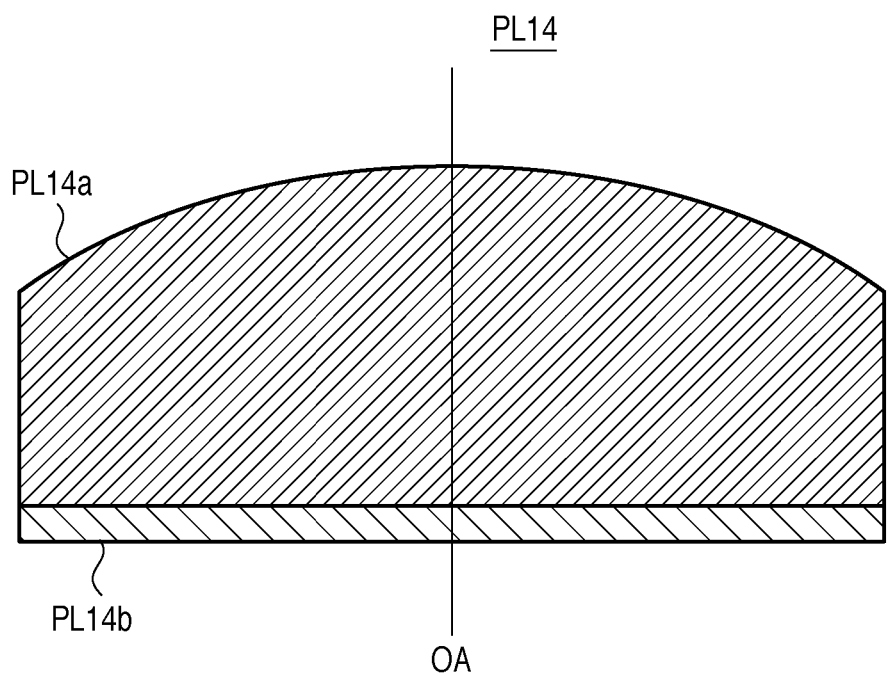
FIG. 16 is an enlarged partial sectional view of a lens forming the projection optical system shown in FIG. 8.

The lenses near the image plane will be explained below with reference to FIGS. 14 to 16. FIG. 14 is an enlarged partial sectional view of a lens PL12 forming the projection optical system 100 shown in FIG. 8. FIG. 15 is an enlarged partial sectional view of a lens PL13 forming the projection optical system 100 shown in FIG. 8. FIG. 16 is an enlarged partial sectional view of a lens PL14 forming the projection optical system 100 shown in FIG. 8.

As shown in FIG. 14, the lens PL12 is a cemented lens obtained by cementing lenses PL12a and PL12b. Note that one of the lenses PL12a and PL12b is a lens (the first lens) having the properties of compaction for a long term, and the other is a lens (the second lens) having the properties of rarefaction for a long term.

As shown in FIG. 15, the lens PL13 is a cemented lens obtained by cementing lenses PL13a and PL13b. Note that one of the lenses PL13a and PL13b is a lens (the first lens) having the properties of compaction for a long term, and the other is a lens (the second lens) having the properties of rarefaction for a long term.

As shown in FIG. 16, the lens PL14 is a cemented lens obtained by cementing lenses PL14a and PL14b. Note that one of the lenses PL14a and PL14b is a lens (the first lens) having the properties of compaction for a long term, and the other is a lens (the second lens) having the properties of rarefaction for a long term.

Table 3 below shows the numerical specifications (the curvature, thickness, and refractive index) of the lens PL12 (lenses PL12a and PL12b), the lens PL13 (lenses PL13a and PL13b), and the lens PL14 (lenses PL14a and PL14b). Table 3 also shows the distance DB of each lens.

TABLE 3

| Lens | Radius of curvature | Thickness | Refractive index | DB | TT/DB |
|---|---|---|---|---|---|
| PL12a | 143.476 | 4.151 | 1.560326 | 149.5 | 8.4 |
| | 123.660 | 0.000 | | | |
| PL12b | 123.660 | 50.000 | 1.560326 | 122.4 | 10.2 |
| | 362.448 | 1.000 | | | |
| PL13a | 98.976 | 5.882 | 1.560326 | 93.4 | 13.4 |
| | 90.000 | 0.000 | | | |
| PL13b | 90.000 | 28.000 | 1.560326 | 76.5 | 16.3 |
| | 141.188 | 1.000 | | | |
| PL14a | 124.903 | 53.494 | 1.560326 | 34.7 | 36.0 |
| | ∞ | 0.000 | | | |
| PL14b | ∞ | 5.000 | 1.560326 | 5.5 | 227.2 |
| | ∞ | | | | |

The lenses PL12a and PL12b are formed to satisfy expression (3). Also, the lenses PL13a and PL13b and the lenses PL14a and PL14b are formed to satisfy expressions (3) and (4).

In this arrangement, the influence of rarefaction on the imaging performance cancels that of compaction on the imaging performance, so stable imaging performance can be obtained for a long time period. In addition, the lenses PL13a and PL13b and the lenses PL14a and PL14b meeting expression (4) are irradiated with an energy density higher than that irradiating the lenses PL12a and PL12b meeting expression (3), so a higher effect can be obtained by the former lenses.

Figure 17:
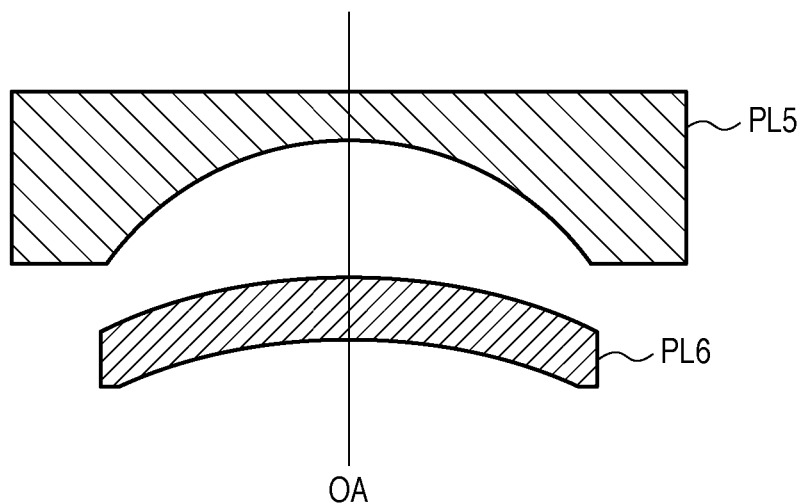
FIG. 17 is an enlarged partial sectional view of a lens forming the projection optical system shown in FIG. 8.
Figure 18:
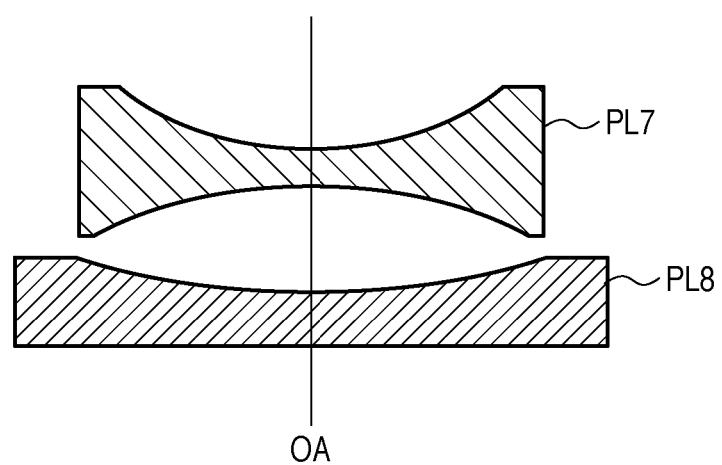
FIG. 18 is an enlarged partial sectional view of a lens forming the projection optical system shown in FIG. 8.

The lenses close to the waist position will be explained below with reference to FIGS. 17 and 18. FIG. 17 is an enlarged partial sectional view of lenses PL5 and PL6 forming the projection optical system 100 shown in FIG. 8. FIG. 18 is an enlarged partial sectional view of lenses PL7 and PL8 forming the projection optical system 100 shown in FIG. 8.

As shown in FIG. 17, the lenses PL5 and PL6 are not cemented lenses but normal lenses. One of the lenses PL5 and PL6 is a lens (the first lens) having the properties of compaction for a long term, and the other is a lens (the second lens) having the properties of rarefaction for a long term.

As shown in FIG. 18, the lenses PL7 and PL8 are not cemented lenses but normal lenses. One of the lenses PL7 and PL8 is a lens (the first lens) having the properties of compaction for a long term, and the other is a lens (the second lens) having the properties of rarefaction for a long term.

Table 4 below shows the numerical specifications (the curvature, thickness, and refractive index) of the lenses PL5, PL6, PL7, and PL8. Table 4 also shows the distance DW of each lens.

TABLE 4

| Lens | Radius of curvature | Thickness | Refractive index | DW | TT/DW |
|---|---|---|---|---|---|
| PL5 | 8836.695 | 14.000 | 1.560326 | 105.8 | 11.8 |
|  | 84.328 | 37.636 |  |  |  |
| PL6 | 161.547 | 17.000 | 1.560326 | 52.7 | 23.7 |
|  | 143.918 | 44.176 |  |  |  |
| PL7 | −109.833 | 12.000 | 1.560326 | 6.0 | 208.3 |
|  | 147.291 | 33.877 |  |  |  |
| PL8 | −278.731 | 17.398 | 1.560326 | 54.6 | 22.9 |
|  | −10024.728 | 20.517 |  |  |  |

The lenses PL5 and PL6 are formed to satisfy expression (10). Also, the lenses PL7 and PL8 are formed to satisfy expressions (9) and (10).

In this arrangement, the influence of rarefaction on the imaging performance cancels that of compaction on the imaging performance, so stable imaging performance can be obtained for a long time period. In addition, the lenses PL7 and PL8 meeting expression (10) are irradiated with an energy density higher than that irradiating the lenses PL5 and PL6 meeting expression (9), so a higher effect can be obtained by the former lenses.

Figure 19:
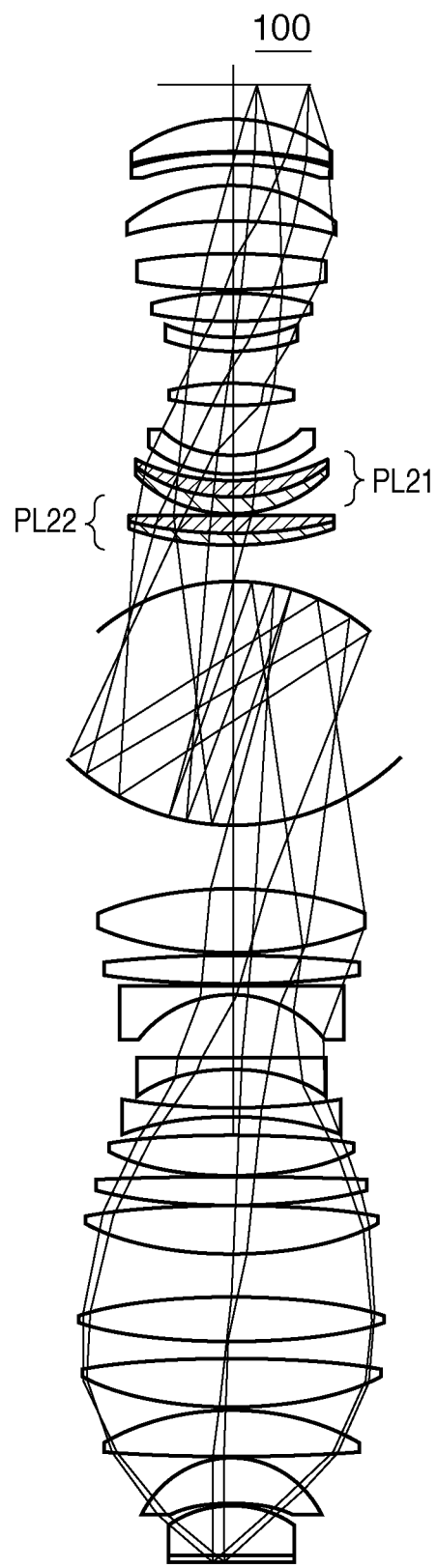
FIG. 19 is a schematic sectional view showing an example of a practical arrangement of the projection optical system as an aspect of the present invention.

FIG. 19 is a schematic sectional view showing a projection optical system 100 formed by referring to Table 37 of International Publication WO2005/069055. The projection optical system 100 shown in FIG. 19 is formed by arranging lenses made of glass materials (synthetic silica glass) having opposite refractive index changes due to ultraviolet irradiation near the intermediate image position of a real image.

Figure 20:
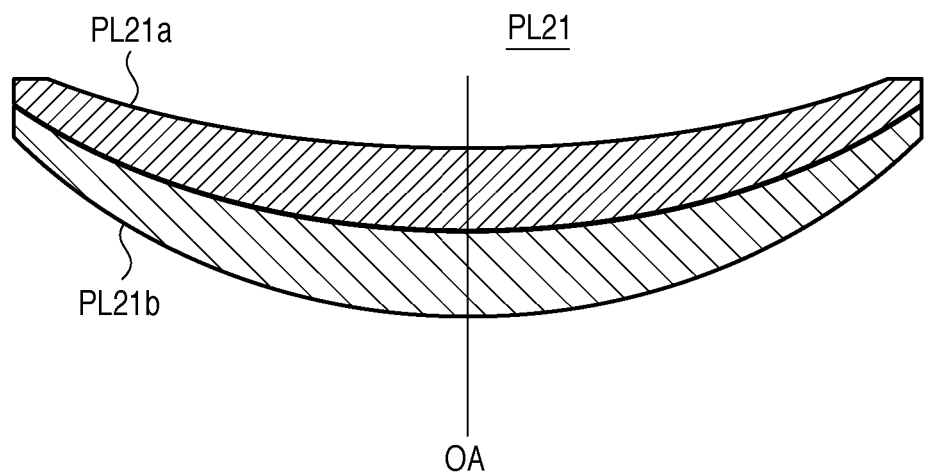
FIG. 20 is an enlarged partial sectional view of a lens forming the projection optical system shown in FIG. 19.
Figure 21:
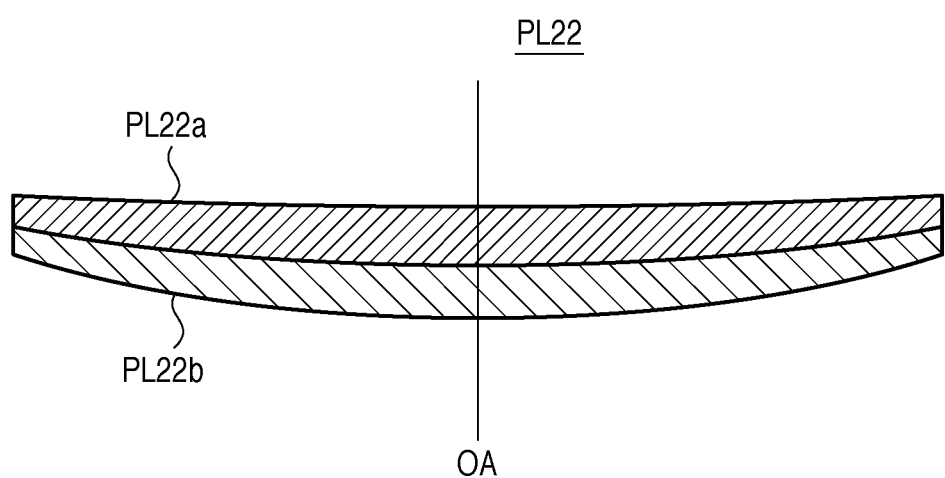
FIG. 21 is an enlarged partial sectional view of a lens forming the projection optical system shown in FIG. 19.

The lenses near the intermediate image position of a real image will be explained below with reference to FIGS. 20 and 21. FIG. 20 is an enlarged partial sectional view of a lens PL21 defined by Surfaces 18 and 19 in Table 37 of International Publication WO2005/069055. FIG. 21 is an enlarged partial sectional view of a lens PL22 defined by Surfaces 20 and 21 in Table 37 of International Publication WO2005/069055.

As shown in FIG. 20, the lens PL21 is a cemented lens obtained by cementing lenses PL21a and PL21b. Note that one of the lenses PL21a and PL21b is a lens (the first lens) having the properties of compaction for a long term, and the other is a lens (the second lens) having the properties of rarefaction for a long term.

As shown in FIG. 21, the lens PL22 is a cemented lens obtained by cementing lenses PL22a and PL22b. Note that one of the lenses PL22a and PL22b is a lens (the first lens) having the properties of compaction for a long term, and the other is a lens (the second lens) having the properties of rarefaction for a long term.

Table 5 below shows the numerical specifications (the curvature, thickness, and material) of the lens PL21 (lenses PL21a and PL21b) and the lens PL22 (lenses PL22a and PL22b). Table 5 also shows the distance DC of each lens. Note that a lens material SILUV shown in Table 5 indicates crystal glass to be used in an application using ultraviolet light.

TABLE 5

| Lens | Radius of curvature | Thickness | Material | DC | TT/DF |
|---|---|---|---|---|---|
| PL21a | −227.124051 | 14.708033 | SILUV | 201.9 | 6.2 |
|  | −151.628870 | 0.000000 |  |  |  |
| PL21b | −151.628870 | 15.000000 | SILUV | 187.1 | 6.7 |
|  | −115.706665 | 0.999372 |  |  |  |
| PL22a | −6458.564488 | 11.246094 | SILUV | 172.9 | 7.2 |
|  | −512.559200 | 0.000000 |  |  |  |
| PL22b | −512.559200 | 10.000000 | SILUV | 162.3 | 7.7 |
|  | −316.595524 |  |  |  |  |

The lenses PL21a and PL21b are formed to satisfy expression (7). Also, the lenses PL22a and PL22b are formed to satisfy expressions (7) and (8).

In this arrangement, the influence of rarefaction on the imaging performance cancels that of compaction on the imaging performance, so stable imaging performance can be obtained for a long time period. In addition, the lenses PL22a and PL22b meeting expression (8) are irradiated with an energy density higher than that irradiating the lenses PL21a and PL21b meeting expression (7), so a higher effect can be obtained by the former lenses.

Note that in the projection optical system 100 shown in FIG. 19, the lenses near the pupil position and imaging conjugate position can also be lenses made of glass materials (synthetic silica glass) having opposite refractory index changes due to ultraviolet irradiation.

An exposure apparatus to which the projection optical system as an aspect of the present invention is applied will be explained below.

Figure 22:
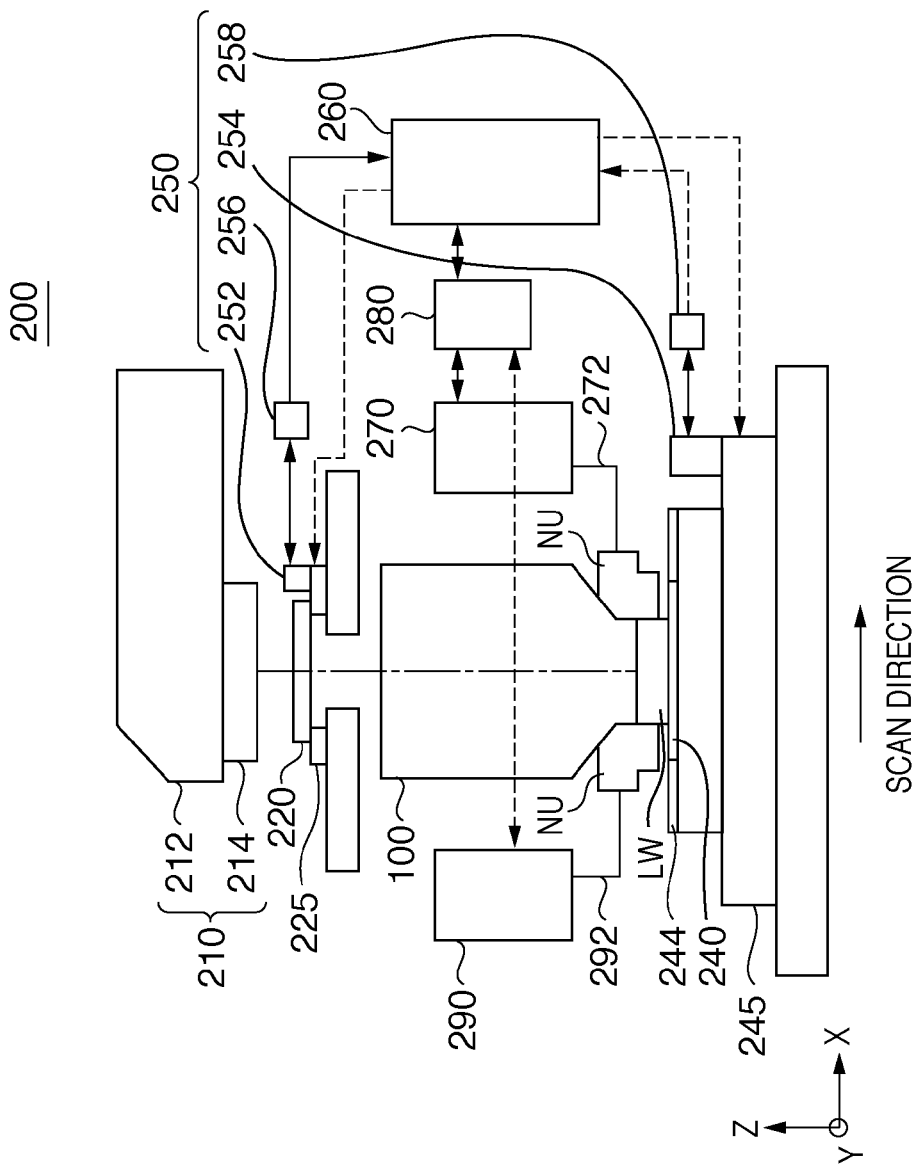
FIG. 22 is a schematic sectional view showing the arrangement of an exposure apparatus as an aspect of the present invention.

FIG. 22 is a schematic sectional view showing the arrangement of an exposure apparatus 200 as an aspect of the present invention. The exposure apparatus 200 is an immersion exposure apparatus that exposes a wafer 240 to patterns of a reticle 220 by the step-and-scan method via a liquid LW supplied between a projection optical system 100 and the wafer 240.

As shown in FIG. 22, the exposure apparatus 200 includes an illumination apparatus 210, a reticle stage 225 on which the reticle 220 is placed, the projection optical system 100, a wafer stage 245 on which the wafer 240 is placed, a distance measuring unit 250, and a stage controller 260. The exposure apparatus 200 also includes a liquid supply unit 270, immersion controller 280, liquid recovery unit 290, and nozzle unit NU.

The illumination apparatus 210 has a light source unit 212 and illumination optical system 214. In this embodiment, an ArF excimer laser having a wavelength of 193 nm is used as the light source of the light source unit 212.

The illumination optical system 214 is an optical system that illuminates the reticle 220 with light from the light source unit 212.

The reticle 220 is transferred from outside the exposure apparatus 200 by a reticle transfer system (not shown), and supported and driven by the reticle stage 225.

The reticle stage 225 supports the reticle 220 via a reticle chuck (not shown), and is controlled by the stage controller 260.

The projection optical system 100 is a projection optical system that projects patterns on the reticle 220 set on the object plane onto the wafer 240 set on the image plane. Any of the above-mentioned forms can be applied to the projection optical system 100, so a repetitive explanation will be omitted.

The wafer 240 is a substrate onto which the patterns of the reticle 220 are projected (transferred). However, the wafer 240 may also be replaced with a glass plate or another substrate. The wafer 240 is coated with a photoresist.

A liquid holder 244 is formed around the wafer 240 supported by the wafer stage 245. The liquid holder 244 is a plate having a surface at the same height as that of the wafer 240. When exposing shots near the outer periphery of the wafer 240, the liquid holder 244 holds the liquid LW in a region outside the wafer 240.

The distance measuring unit 250 measures the positions of the reticle stage 225 and wafer stage 245 in real time by using reference mirrors 252 and 254 and laser interferometers 256 and 258. The measurement results obtained by the distance measuring unit 250 are transmitted to the stage controller 260.

Based on the measurement results obtained by the distance measuring unit 250, the stage controller 260 controls driving of the reticle stage 225 and wafer stage 245 in order to control positioning and synchronization.

The liquid supply unit 270 supplies the liquid LW to the space or gap between the final lens of the projection optical system 100 and the wafer 240. The liquid supply unit 270 has a liquid supply pipe 272. The liquid supply unit 270 supplies the liquid LW through the liquid supply pipe 272 placed around the final lens of the projection optical system 100. Consequently, a liquid film of the liquid LW is formed in the space between the projection optical system 100 and wafer 240.

The immersion controller 280 acquires information such as the present position, velocity, and acceleration of the wafer stage 245 from the stage controller 260, and controls immersion exposure based on the information.

The liquid recovery unit 290 has a function of recovering the liquid LW supplied between the projection optical system 100 and wafer 240 by the liquid supply unit 270, and has a liquid recovery pipe 292. The liquid recovering pipe 292 recovers the liquid LW supplied between the projection optical system 100 and wafer 240 by the liquid supply unit 270, through a liquid recovery port formed in the nozzle unit NU.

A liquid supply port and the liquid recovery port are formed in that side of the nozzle unit NU which faces the wafer 240. The liquid supply port is a supply port for supplying the liquid LW, and connected to the liquid supply pipe 272. The liquid recovery port is an opening for recovering the supplied liquid LW, and connected to the liquid recovery pipe 292.

During exposure, the illumination optical system 214 illuminates the reticle 220 with a light beam emitted from the light source unit 212. The projection optical system 100 forms an image of the patterns of the reticle 220 on the wafer 240 via the liquid LW.

As previously described, the projection optical system 100 used by the exposure apparatus 200 can achieve stable imaging performance for a long time because the influence of rarefaction on the imaging performance cancels that of compaction on the imaging performance. In other words, the projection optical system 100 can assure the exposure performance of the exposure apparatus 200 for a long time period.

Accordingly, the exposure apparatus 200 can economically provide devices (e.g., a semiconductor element, an LCD element, an image sensing element (e.g., a CCD), and a thin-film magnetic head) with a high throughput. These devices are fabricated through a step of exposing a substrate (e.g., a wafer or glass plate) coated with a photoresist (sensitizer) by using the exposure apparatus 200, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-265715 filed on Oct. 14, 2008, which is hereby incorporated by reference herein in its entirety.

What is claimed is:

1. A projection optical system for projecting a pattern of an object plane onto an image plane, comprising:
    a first lens whose refractive index increases by ultraviolet irradiation; and
    a second lens whose refractive index decreases by the ultraviolet irradiation,
    wherein letting TT be a distance between a first intersection as an intersection of the object plane and an optical axis of the projection optical system, and a second intersection as an intersection of the image plane and the optical axis,
    a distance D1 between a first central position as a central position of a thickness of the first lens on the optical axis and an intersection position of one of the first intersection and the second intersection which is closer to the first central position satisfies $D1 \leq TT/8$, and a distance D2 between a second central position as a central position of a thickness of the second lens on the optical axis and the intersection position satisfies $D2 \leq TT/8$.

2. The system according to claim 1, wherein the second lens is made of a glass material containing a main component of the first lens.

3. The system according to claim 1, wherein the first lens and the second lens are adjacent to each other.

4. The system according to claim 3, wherein the first lens and the second lens are cemented.

5. The system according to claim 4, wherein the first lens and the second lens are cemented by an optical contact.

6. The system according to claim 4, wherein the first lens and the second lens are cemented by an adhesive.

7. The system according to claim 1, wherein the first lens and the second lens are made of synthetic silica glass.

8. The system according to claim 1, wherein the first lens and the second lens have different OH group densities.

9. The system according to claim 1, wherein the first lens and the second lens have different hydrogen molecular densities.

10. A projection optical system for projecting a pattern of an object plane onto an image plane, comprising:
    a first lens whose refractive index increases by ultraviolet irradiation; and
    a second lens whose refractive index decreases by the ultraviolet irradiation,
    wherein at least one intermediate image is formed between the object plane and the image plane, and
    letting TT be a distance between a first intersection as an intersection of the object plane and an optical axis of the projection optical system, and a second intersection as an intersection of the image plane and the optical axis,
    a distance DC1 between a first central position as a central position of a thickness of the first lens on the optical axis and an intermediate image position of one of the at least one intermediate image which is closest to the first central position satisfies $DC1 \leq TT/6$, and a distance DC2 between a second central position as a central position of a thickness of the second lens on the optical axis and the intermediate image position satisfies $$DC2 \leq TT/6.$$

11. A projection optical system for projecting a pattern of an object plane onto an image plane, comprising:
a first lens whose refractive index increases by ultraviolet irradiation; and
a second lens whose refractive index decreases by the ultraviolet irradiation,
wherein at least one pupil is formed between the object plane and the image plane, and
letting TT be a distance between a first intersection as an intersection of the object plane and an optical axis of the projection optical system, and a second intersection as an intersection of the image plane and the optical axis,
a distance DP1 between a first central position as a central position of a thickness of the first lens on the optical axis and a pupil position of one of the least one pupil which is closest to the first central position satisfies $$DP1 \leq TT/8, \text{ and}$$

a distance DP2 between a second central position as a central position of a thickness of the second lens on the optical axis and the pupil position satisfies $$DP2 \leq TT/8.$$

12. A projection optical system for projecting a pattern of an object plane onto an image plane, comprising:
a first lens whose refractive index increases by ultraviolet irradiation; and
a second lens whose refractive index decreases by the ultraviolet irradiation,
wherein letting TT be a distance between a first intersection as an intersection of the object plane and an optical axis of the projection optical system, and a second intersection as an intersection of the image plane and the optical axis,
a distance DW1 between a first central position as a central position of a thickness of the first lens on the optical axis and a waist position of the projection optical system at a shortest distance from the first central position satisfies $$DW1 \leq TT/11,$$

a distance DW2 between a second central position as a central position of a thickness of the second lens on the optical axis of the projection optical system and the waist position satisfies $$DW2 \leq TT/11, \text{ and}$$

between a pupil of the projection optical system and a lens surface which is one of lens surfaces of a plurality of lenses forming the projection optical system and on which a distance between a most off-axis principal ray and the optical axis of the projection optical system is maximum, the waist position is a position of an intersection of a lens surface on which an effective region is minimum and the optical axis of the projection optical system.

13. An exposure apparatus comprising:
an illumination optical system configured to illuminates a reticle with light from a light source; and
a projection optical system configured to project a pattern of the reticle set on an object plane onto a substrate set on an image plane,
wherein the projection optical system includes:
a first lens whose refractive index increases by ultraviolet irradiation; and
a second lens whose refractive index decreases by the ultraviolet irradiation,
wherein letting TT be a distance between a first intersection as an intersection of the object plane and an optical axis of the projection optical system, and a second intersection as an intersection of the image plane and the optical axis,
a distance D1 between a first central position as a central position of a thickness of the first lens on the optical axis and an intersection position of one of the first intersection and the second intersection which is closer to the first central position satisfies $$D1 \leq TT/8, \text{ and}$$

a distance D2 between a second central position as a central position of a thickness of the second lens on the optical axis system and the intersection position satisfies $$D2 \leq TT/8.$$

14. A method comprising:
exposing a substrate using an exposure apparatus; and
performing a development process for the substrate exposed,
wherein the exposure apparatus includes:
an illumination optical system configured to illuminates a reticle with light from a light source; and
a projection optical system configured to project a pattern of the reticle set on an object plane onto the substrate set on an image plane,
wherein the projection optical system includes:
a first lens whose refractive index increases by ultraviolet irradiation; and
a second lens whose refractive index decreases by the ultraviolet irradiation,
wherein at least one pupil is formed between the object plane and the image plane, and
letting TT be a distance between a first intersection as an intersection of the object plane and an optical axis of the projection optical system, and a second intersection as an intersection of the image plane and the optical axis,
a distance DP1 between a first central position as a central position of a thickness of the first lens on the optical axis and a pupil position at a shortest distance from the first central position satisfies $$DP1 \leq TT/8, \text{ and}$$

a distance DP2 between a second central position as a central position of a thickness of the second lens on the optical axis and the pupil position satisfies $$DP2 \leq TT/8.$$

15. An optical system for projecting a pattern of an object plane onto an image plane, comprising:
a first lens whose refractive index increases by ultraviolet irradiation; and
a second lens whose refractive index decreases by the ultraviolet irradiation,
wherein letting TT be a distance between a first intersection as an intersection of the object plane and an optical axis of the optical system, and a second intersection as an intersection of the image plane and the optical axis,
a distance D1 between a first central position as a central position of a thickness of the first lens on the optical axis and an intersection position of one of the first intersection and the second intersection which is closer to the first central position satisfies $D1 \leq TT/8$.

16. The system according to claim 15, wherein
a distance D2 between a second central position as a central position of a thickness of the second lens on the optical axis and the intersection position satisfies $D2 \leq TT/8$.

17. The system according to claim 15, wherein the first and second lenses are cemented.

18. An optical system for projecting a pattern of an object plane onto an image plane, comprising:
- a first lens whose refractive index increases by ultraviolet irradiation; and
- a second lens whose refractive index decreases by the ultraviolet irradiation,
- wherein at least one intermediate image is formed between the object plane and the image plane, and
- letting TT be a distance between a first intersection as an intersection of the object plane and an optical axis of the optical system, and a second intersection as an intersection of the image plane and the optical axis,
- a distance DC1 between a first central position as a central position of a thickness of the first lens on the optical axis and an intermediate image position of one of the at least one intermediate image which is closest to the first central position satisfies $DC1 \leq TT/6$.

19. The system according to claim 18, wherein
a distance DC2 between a second central position as a central position of a thickness of the second lens on the optical axis and the intermediate image position satisfies $DC2 \leq TT/6$.

* * * * *